(12) United States Patent
Hirata

(10) Patent No.: US 10,725,216 B2
(45) Date of Patent: Jul. 28, 2020

(54) ONBOARD CAMERA

(71) Applicant: MAXELL, LTD., Kyoto (JP)

(72) Inventor: Koji Hirata, Osaka (JP)

(73) Assignee: MAXELL, LTD., Kyoto (JP)

( * ) Notice: Subject to any disclaimer, the term of this patent is extended or adjusted under 35 U.S.C. 154(b) by 0 days.

(21) Appl. No.: 15/562,522

(22) PCT Filed: Apr. 8, 2015

(86) PCT No.: PCT/JP2015/061022
§ 371 (c)(1),
(2) Date: Sep. 28, 2017

(87) PCT Pub. No.: WO2016/162983
PCT Pub. Date: Oct. 13, 2016

(65) Prior Publication Data
US 2018/0095206 A1   Apr. 5, 2018

(51) Int. Cl.
*G02B 5/26* (2006.01)
*H04N 5/238* (2006.01)
(Continued)

(52) U.S. Cl.
CPC ............... *G02B 5/26* (2013.01); *B60R 11/04* (2013.01); *G02B 5/30* (2013.01); *G03B 11/00* (2013.01);
(Continued)

(58) Field of Classification Search
None
See application file for complete search history.

(56) References Cited

U.S. PATENT DOCUMENTS 8,427,570 B2    4/2013  Adachi et al.
2006/0257589 A1*  11/2006  Hayashi ............... C08J 5/18
                                            428/1.2
(Continued)

FOREIGN PATENT DOCUMENTS

JP    11-078737 A    3/1999
JP   2003-099885 A   4/2003
(Continued)

OTHER PUBLICATIONS

International Search Report of PCT/JP2015/061022 dated Jul. 14, 2015.
(Continued)

*Primary Examiner* — Frederick D Bailey
(74) *Attorney, Agent, or Firm* — Mattingly & Malur, PC

(57) ABSTRACT

The onboard camera is mounted in a vehicle to shoot a driving environment of the vehicle by receiving external light from outside of the vehicle, the onboard camera includes: a camera unit having a lens unit which generates an image by receiving the external light and an image-capturing device which generates an image signal based on the image generated by the lens unit; and a polarization plate arranged in front of the camera unit, the image-capturing device constituting the camera unit is a CMOS image sensor, and the polarization plate is a polarization plate whose cross transmittance with respect to S-polarized wave having a wavelength from 420 nm to 700 nm is 5 to 20% or a polarization plate whose parallel transmittance with respect to natural light having a wavelength from 420 nm to 700 nm is 45 to 60%.

6 Claims, 9 Drawing Sheets

(51) Int. Cl.
*B60R 11/04* (2006.01)
*G03B 11/00* (2006.01)
*G03B 15/00* (2006.01)
*H04N 5/225* (2006.01)
*H04N 9/04* (2006.01)
*H04N 5/33* (2006.01)
*G02B 5/30* (2006.01)
*B60R 11/00* (2006.01)
*G02B 27/28* (2006.01)
*G03B 11/04* (2006.01)

(52) U.S. Cl.
CPC ........... G03B 15/00 (2013.01); H04N 5/2254 (2013.01); H04N 5/238 (2013.01); H04N 5/332 (2013.01); H04N 9/045 (2013.01); *B60R 2011/0026* (2013.01); *G02B 27/283* (2013.01); *G03B 11/045* (2013.01)

(56) References Cited

U.S. PATENT DOCUMENTS

| | | | | |
|---|---|---|---|---|
| 2009/0122234 | A1* | 5/2009 | Ito | C08J 5/18 |
| | | | | 349/96 |
| 2010/0271482 | A1* | 10/2010 | Otsuki | G02B 5/208 |
| | | | | 348/148 |
| 2010/0282945 | A1 | 11/2010 | Yokogawa | |
| 2011/0285898 | A1 | 11/2011 | Kasahara et al. | |
| 2012/0268602 | A1 | 10/2012 | Hirai et al. | |
| 2014/0034835 | A1* | 2/2014 | Frey | G01J 1/0437 |
| | | | | 250/349 |
| 2014/0091418 | A1* | 4/2014 | Taguchi | C09B 23/04 |
| | | | | 257/432 |
| 2014/0242300 | A1* | 8/2014 | Nojiri | C08K 5/3462 |
| | | | | 428/1.31 |
| 2016/0118428 | A1* | 4/2016 | Tsau | H01L 27/14616 |
| | | | | 250/208.1 |
| 2017/0345860 | A1* | 11/2017 | Nagaya | G02B 5/22 |

FOREIGN PATENT DOCUMENTS

| | | |
|---|---|---|
| JP | 2005-341522 A | 12/2005 |
| JP | 2006-033493 A | 2/2006 |
| JP | 2007-65555 A | 3/2007 |
| JP | 2008-016918 A | 1/2008 |
| JP | 2010-109562 A | 5/2010 |
| JP | 2010-171861 A | 8/2010 |
| JP | 2010-230776 A | 10/2010 |
| JP | 2010-263158 A | 11/2010 |
| JP | 2011-55135 A | 3/2011 |
| JP | 2011-150688 A | 8/2011 |
| JP | 2013-097223 A | 5/2013 |
| JP | 5417773 2 B | 2/2014 |
| TW | I403807 B | 8/2013 |

OTHER PUBLICATIONS

Japanese Office Action received in corresponding Japanese Application No. 2017-511403 dated Mar. 5, 2019.

* cited by examiner

ONBOARD CAMERA

TECHNICAL FIELD

The present invention relates to an onboard camera mounted in a vehicle including an automobile and shooting a driving environment in front of or behind the vehicle, and more particularly relates to a technique for reducing interior reflection of external light.

BACKGROUND ART

In recent years, various kinds of onboard cameras mounted in a vehicle and shooting a driving environment in front of (or behind) the vehicle have been proposed. However, conventionally, when the onboard camera shoots a driving environment in front of the vehicle through a front windshield (front glass) during the driving in the daytime, a dashboard or the like is reflected on the front windshield, and this reflection is superimposed on an acquired image of the front or the back of the vehicle, so that the accuracy and contrast of the acquired image are degraded. As means for solving this problem, a technique for installing a polarization filter on a front face of the camera or in the vicinity thereof (outside of the field of view of the imaging lens) is known by the following Patent Documents.

RELATED ART DOCUMENTS

Patent Documents

Patent Document 1: Japanese Patent Application Laid-Open Publication No. H11-78737
Patent Document 2: Japanese Patent No. 5417773

SUMMARY OF THE INVENTION

Problems to be Solved by the Invention

The conventional technique described above, in particular, the above-mentioned Patent Document 1 intends to attenuate the amount of light from the outside of the vehicle (external light) by installing the polarization filter. Therefore, when the camera shoots the driving environment in front of the vehicle, an excessive attenuation of the light amount is caused because the polarized wave on one side is cut by the polarization filter, and the acquired image is different from human vision in some cases, for example, the acquired image does not show a subject that is expected to be shown. In order to solve this problem, the above-mentioned Patent Document 2 devises the position where the polarization filter is attached. However, even in the above-described conventional technique, the influence caused by the attenuation of the light amount on the captured image is not sufficiently taken into consideration.

Likewise, during the driving at night, illumination light such as street light enters through the front windshield and light diffusely reflected by the dashboard reflects back to the front windshield, and this reflection is superimposed on an acquired image of the front or the back of the vehicle, so that the accuracy and contrast of the acquired image are degraded.

Meanwhile, during the driving at night, there is also a problem that the beam of automobile headlight of the oncoming vehicle directly enters into the image-capturing device and causes halation beyond the allowable value of the sensitivity.

Further, the novel safety and security issues in driving automobiles are also clarified: for example, the ambient illuminance is insufficient during the driving at night, and the visibility of objects radiating heat rays such as humans and animals decreases.

Thus, the present invention has been made in view of the above-mentioned problems associated with the conventional techniques, and in particular, the present invention has been made in consideration of the relationship between the attenuation of the light amount by the polarization filter and the image thus acquired. Also, an object of the present invention is to provide an onboard camera capable of preventing the reflection in which external light such as sun light during the driving in the daytime and street light during the driving at night illuminates the dashboard or the like, the reflection light on the surface of the dashboard reflects back to the windshield, and consequently an image of the dashboard is superimposed on an acquired image of the front or the back of the vehicle, so that the accuracy and contrast of the acquired image are degraded, and capable of acquiring an image that is not different from human vision.

Means for Solving the Problems

The following is a brief description of an outline of the typical embodiment of the invention disclosed in the present application.

Namely, an onboard camera mounted in a vehicle to shoot a driving environment of the vehicle by receiving external light from outside of the vehicle includes: a camera unit having a lens unit which generates an image by receiving the external light and an image-capturing device which generates an image signal based on the image generated by the lens unit; and a polarization plate arranged in front of the camera unit, the image-capturing device constituting the camera unit is a CMOS image sensor, and the polarization plate is a polarization plate whose cross transmittance with respect to S-polarized wave having a wavelength from 420 nm to 700 nm is 5 to 20% or a polarization plate whose parallel transmittance with respect to natural light having a wavelength from 420 nm to 700 nm is 45 to 60%.

Further, in the onboard camera described above, the CMOS image sensor serving as the image-capturing device constituting the camera unit is configured with four pixels as one unit, a first pixel is configured such that a transmittance with respect to light having a wavelength from 400 nm to 500 nm is 25% or more and a transmittance with respect to light having a wavelength from 550 nm to 750 nm is 10% or less, a second pixel is configured such that a transmittance with respect to light having a wavelength from 510 nm to 590 nm is 25% or more, a transmittance with respect to light having a wavelength from 400 nm to 500 nm is 15% or less, and a transmittance with respect to light having a wavelength from 620 nm to 750 nm is 15% or less, a third pixel is configured such that a transmittance with respect to light having a wavelength from 590 nm to 700 nm is 30% or more, a transmittance with respect to light having a wavelength from 400 nm to 570 nm is 10% or less, and a light ray transmittance with respect to light having a wavelength of 800 nm or more is 20% or less, a fourth pixel has a structure capable of detecting near infrared light having a wavelength from 850 nm to 900 nm, and a transmittance of the polarization plate with respect to infrared light is 45% or more and 100% or less.

Effects of the Invention

The effects obtained by typical embodiments of the invention disclosed in this application will be briefly described below.

Namely, according to the present invention, since the attenuation of the light amount by the polarization filter can be reduced, even a device whose sensitivity of CMOS sensor is low can achieve a sufficient performance, and it is possible to provide an onboard camera capable of preventing the reflection in which external light such as sun light during the driving in the daytime and street light during the driving at night illuminates the dashboard or the like, the reflection light on the surface of the dashboard reflects back to the windshield, and consequently an image of the dashboard is superimposed on an acquired image of the front or the back of the vehicle, so that the accuracy and contrast of the acquired image are degraded, and capable of achieving a higher night visibility for humans, animals, and the like that emit heat rays of 800 nm or more.

BRIEF DESCRIPTIONS OF THE DRAWINGS

DETAILED DESCRIPTION OF PREFERRED EMBODIMENTS

Hereinafter, an onboard camera according to an embodiment of the present invention will be described in details with reference to the attached drawings.

Figure 1:
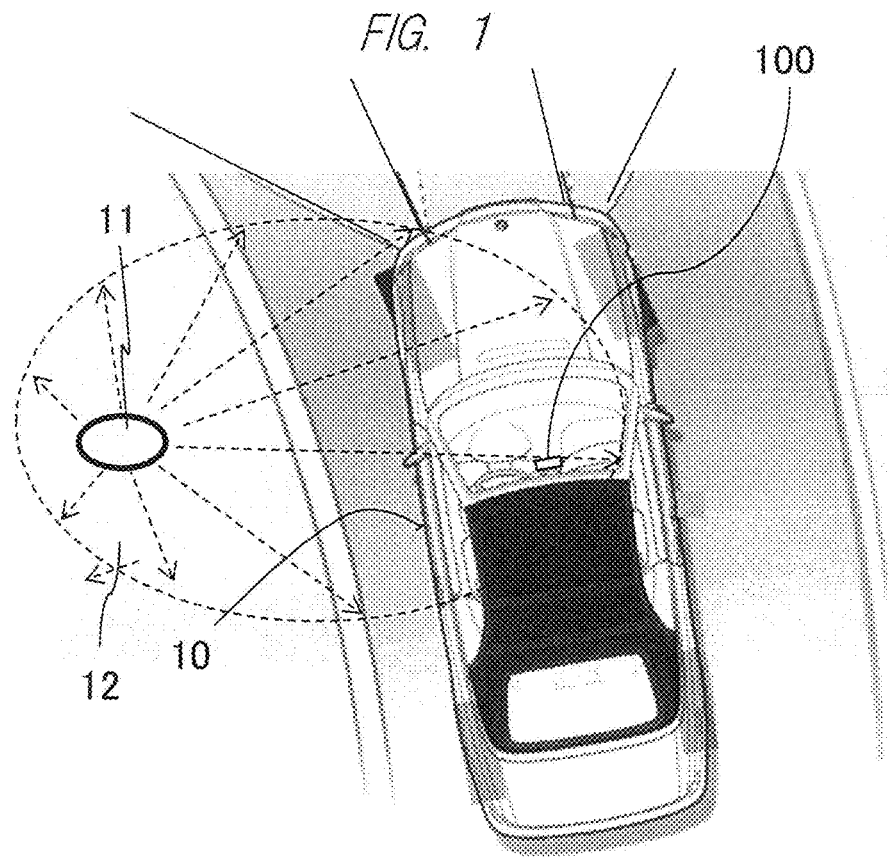
FIG. 1 is a top view illustrating a night driving mode of a vehicle in which an onboard camera according to one embodiment of the present invention is mounted.
Figure 2:
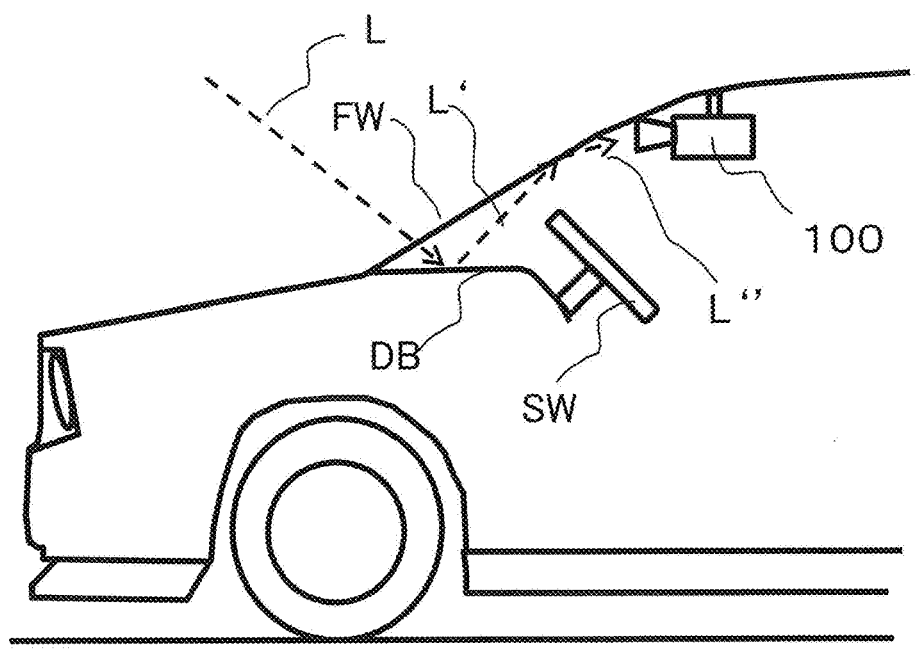
FIG. 2 is a side view illustrating an example of amounting form of the onboard camera into a vehicle according to one embodiment of the present invention.
Figure 3:
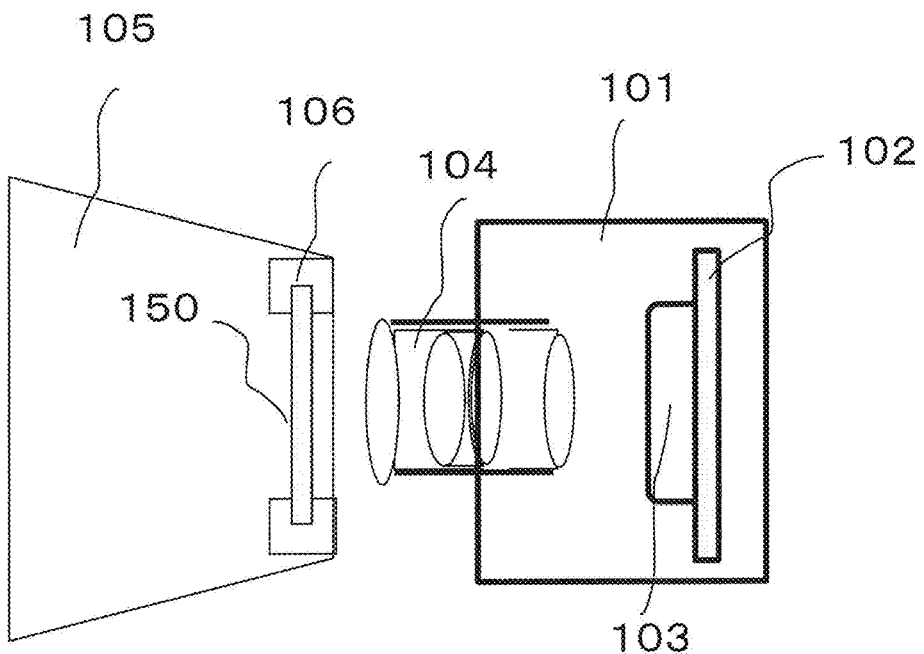
FIG. 3 is a schematic diagram illustrating a structure of the onboard camera according to one embodiment of the present invention.

First, FIG. 1 is a top view illustrating a night driving mode of a vehicle in which the onboard camera according to the present invention is mounted, FIG. 2 is a vertical cross-sectional view illustrating an example of a mounting form of the onboard camera into a vehicle according to the present invention, and FIG. 3 is a schematic diagram illustrating a structure of the onboard camera according to the present invention.

In the example shown in FIG. 1 and FIG. 2, during the driving at night, light 12 emitted from a street light 11 is incident on a dashboard DB through a front windshield FW of an automobile. A case where an onboard camera 100 is attached above the dashboard DB so as to face forward is shown here.

As shown in FIG. 3, the onboard camera 100 described above is constituted of a semiconductor image-capturing device 103 provided on a base plate 102 and a lens unit 104 that are accommodated in a housing 101, and a lens hood 105 is attached to a front side thereof (left side in the figure), and further a polarization plate 150 inserted in a groove 106 formed in a part of the hood is provided. Namely, the scenery (light) outside the vehicle forms an image on a pixel surface on the semiconductor image-capturing device 103 by the lens unit 104, and the image is converted into an image signal, i.e., an electric signal by the semiconductor image-capturing device 103. Then, the image signal is transferred to an image processing device formed of, for example, a computer or the like (not shown) and is processed thereby. Further, the processed signal is displayed on a display device in the vehicle, subjected to a predetermined processing, and then used as various kinds of vehicle information.

The light ray group that has fallen on the dashboard DB of the vehicle, for example, direct light L from the sun in the daytime or direct light L from the street light when driving at night or in a tunnel is diffusely reflected by this dashboard DB and scatters in all directions. A light ray L' which is a part of the scattered light is reflected by the front windshield FW (reflection light L"), and the reflection enters into the onboard camera 100, so that the contrast of the image taken by the camera 100 is degraded.

Likewise, during the driving at night, as shown in FIG. 1, the light 12 emitted from the street light 11 is incident on the dashboard DB through the front windshield FW of the automobile and diffusely reflected to scatter in all directions. A light ray L' which is apart of the scattered light is reflected by the front windshield FW (reflection light L"), and the reflection enters into the onboard camera 100, so that the contrast of the image taken by the onboard camera 100 is degraded.

Here, when focusing on the reflection light reflected on the surface of the front windshield FW, since a larger incidence angle results in a higher reflectance and reflectance of S-polarized light is larger than reflectance of P-polarized light (reflectance of S-polarized light>reflectance of P-polarized light) in general, the polarization plate 150 for particularly cutting (attenuating) the S-polarization is attached to the front face of the onboard camera 100. In this manner, the reflection of the interior and the dashboard D can be reduced.

However, the study conducted by the inventor and others of this application has revealed that, when the capability of attenuating the S-polarized light by the polarization plate 150 attached to the front face of the onboard camera 100 is increased, it is possible to prevent the reflection light L" on the front windshield FW from entering into the onboard camera 100, but on the other hand, there is also a case where the onboard camera 100 is incapable of capturing images of the outside of the vehicle.

The detailed study about this has revealed as follows. That is, since the degree of polarization (value obtained by dividing parallel transmittance by cross transmittance) is too high when a polarization plate in a conventional technique is used as it is, if the capability of cutting (attenuating) the S-polarized light by the polarization plate 150 is high (i.e., the degree of polarization is high) in a case where a CMOS image sensor which is generally inferior in the sensitivity but relatively inexpensive and consumes less power is adopted as an image-capturing device of the onboard camera 100, the light amount from the outside to the CMOS image sensor is reduced and does not reach a threshold value during the driving at night or in a tunnel in particular, so that it is impossible to capture an image of the outside of the vehicle. Thus, as a countermeasure for it, a camera was produced as a trial product using a CMOS image sensor with an increased sensitivity (i.e., expensive sensor). As a result, although the problem mentioned above could be solved, it turned out that the amount of generated noises increased and a good image could not be obtained. Conventionally, as compared with the CCD image sensor used generally, the CMOS image sensor is inferior in sensitivity and the like, but smear and blooming do not occur in principle in the CMOS image sensor, and the CMOS image sensor has excellent capability as an onboard camera.

Figure 15:
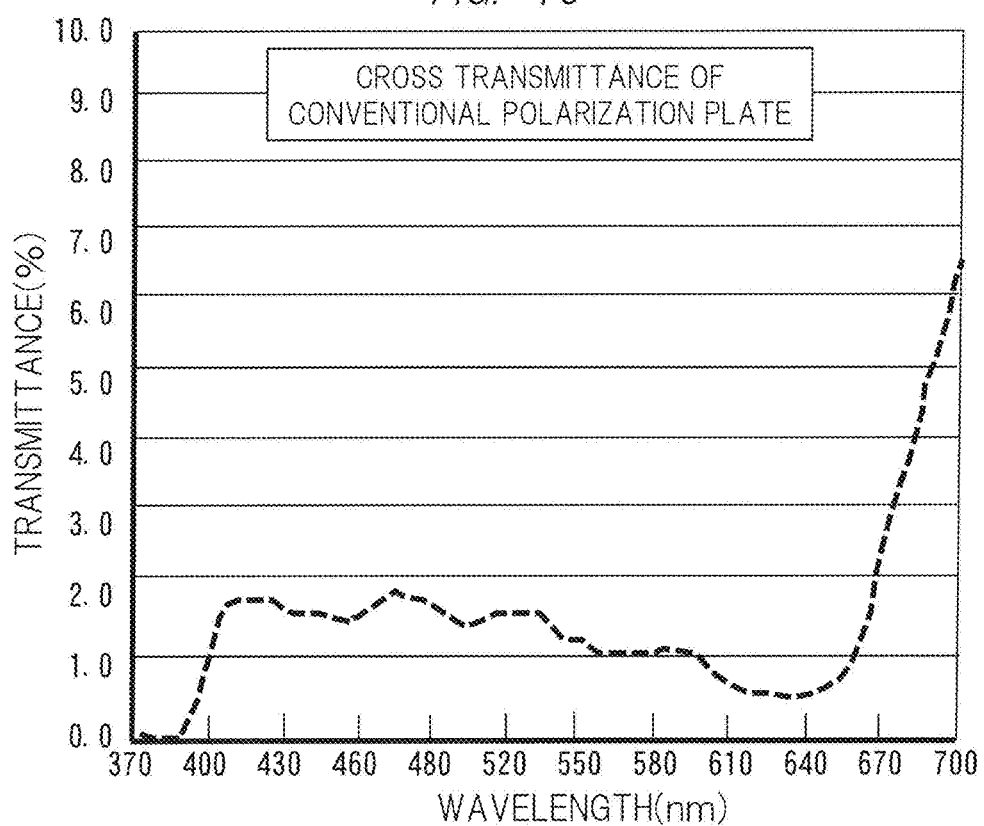
FIG. 15 is a characteristic diagram illustrating a cross transmittance of a generally-available polarization plate.
Figure 16:
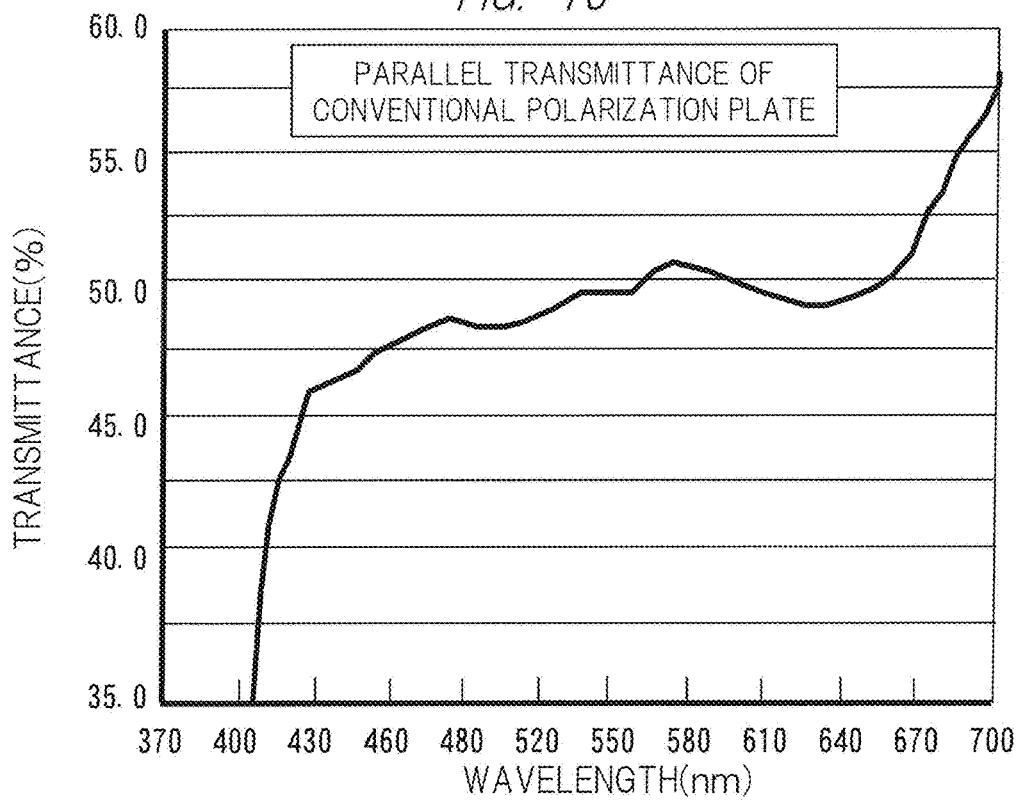
FIG. 16 is a characteristic diagram illustrating a parallel transmittance of the generally-available polarization plate.

An example of the polarization plate of the conventional technique mentioned above is illustrated in FIG. 15 and FIG. 16. More specifically, FIG. 15 illustrates a cross transmittance in a case where the polarization axes of two polarization plates are shifted by 90 degrees, and FIG. 16 illustrates a parallel transmittance in a case where the polarization axes of two polarization plates are aligned.

Thus, the inventor and others of this application focused on the polarization characteristics of the polarization plate 150 attached to the front face of the camera, which affect the attenuation of the light amount entering into the image-capturing device described above. As a result, it was found that, when natural light (S-polarized wave: 50%, P-polarized wave: 50%) passes through the polarization plate 150, the natural light is attenuated to a light amount of approximately 50% in general, but in that case, the light amount entering into the image-capturing device can be adjusted to a proper amount depending on the degree of polarization of the polarization plate 150.

More specifically, a plurality of polarization plates with different polarization characteristics were produced as trial products to obtain the relationship between the cross transmittance and the percentage defective.

Figure 5:
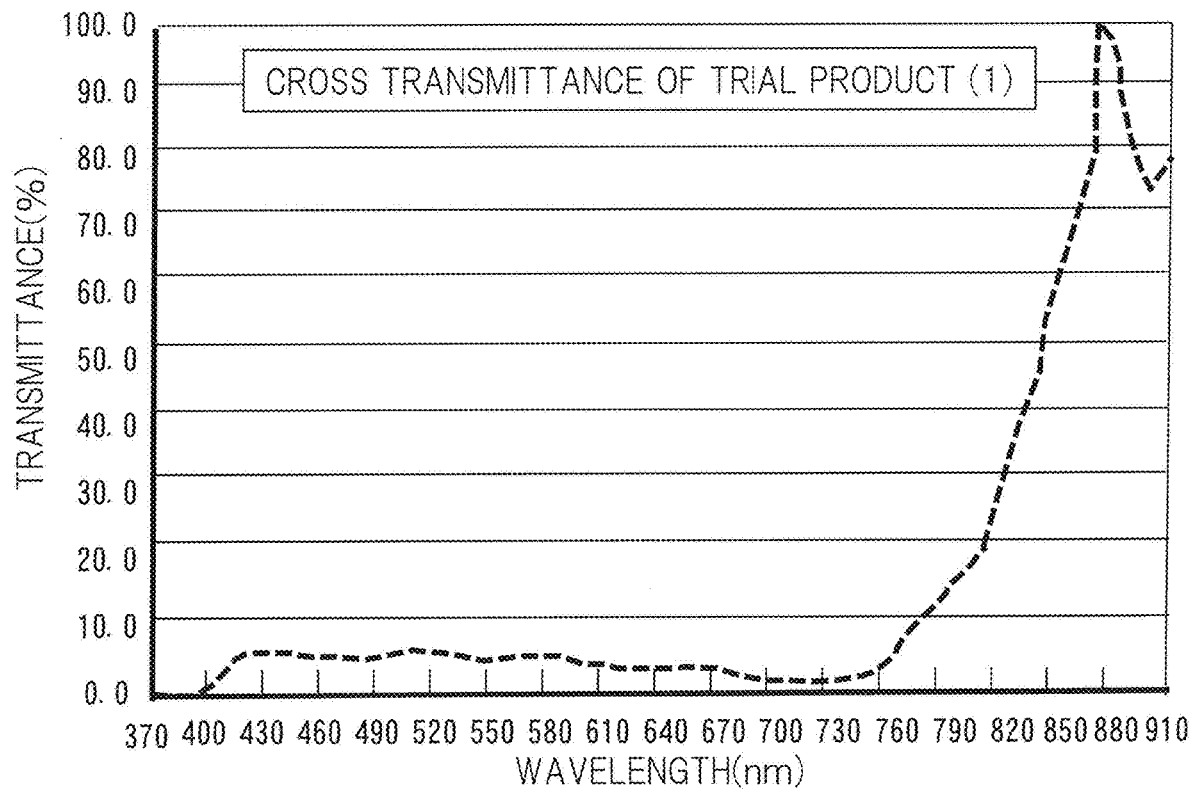
FIG. 5 is a characteristic diagram illustrating a cross transmittance of a polarization plate according to the present invention (trial product (1))
Figure 6:
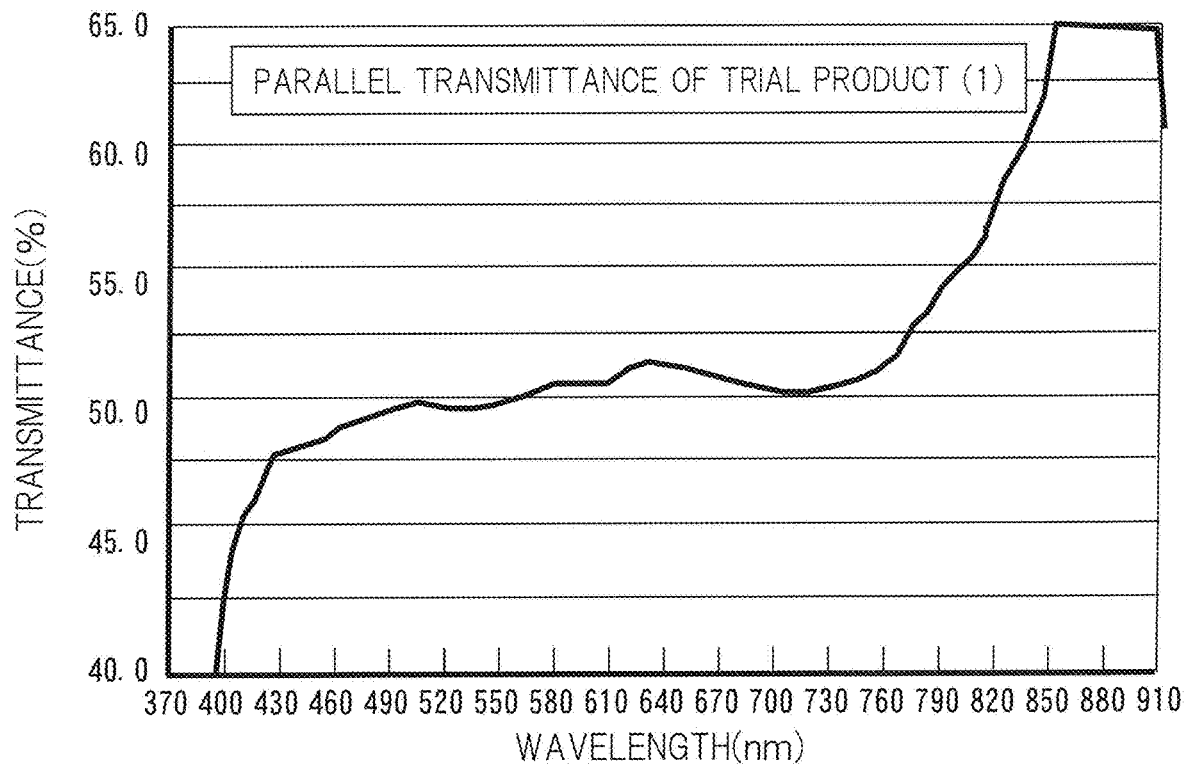
FIG. 6 is a characteristic diagram illustrating a parallel transmittance of the polarization plate according to the present invention (trial product (1))
Figure 7:
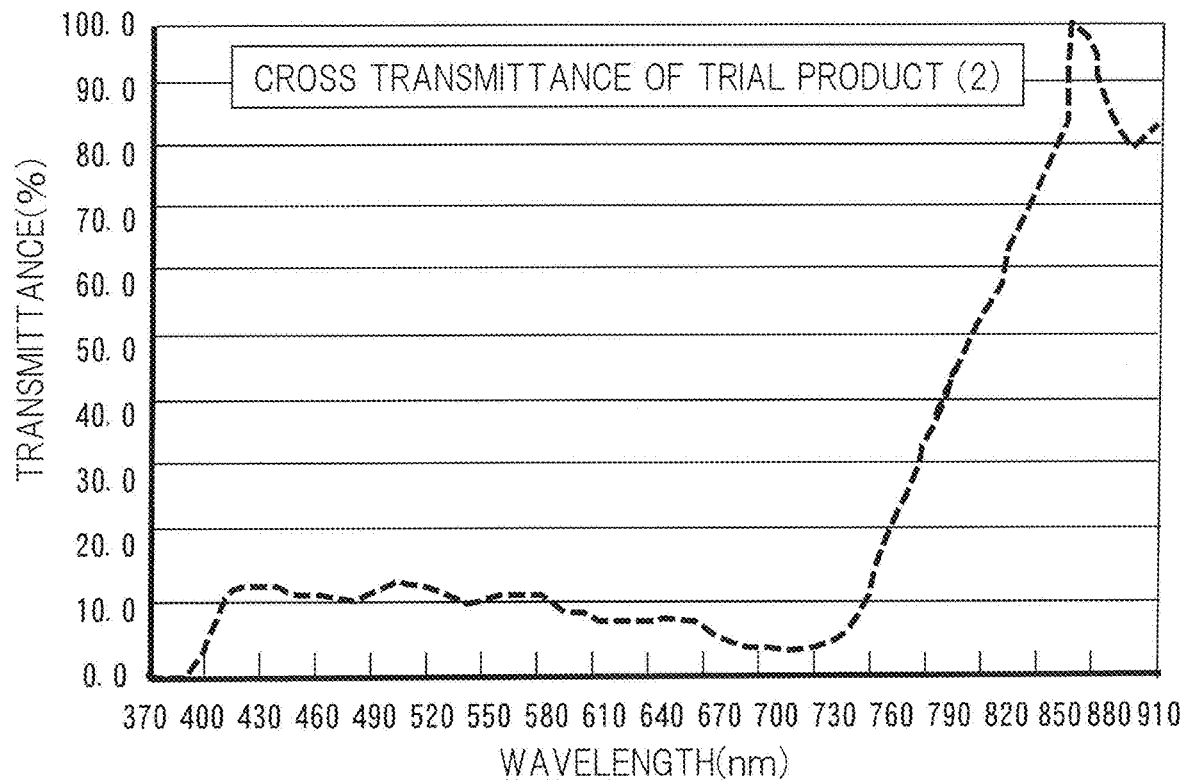
FIG. 7 is a characteristic diagram illustrating a cross transmittance of a polarization plate according to the present invention (trial product (2))
Figure 8:
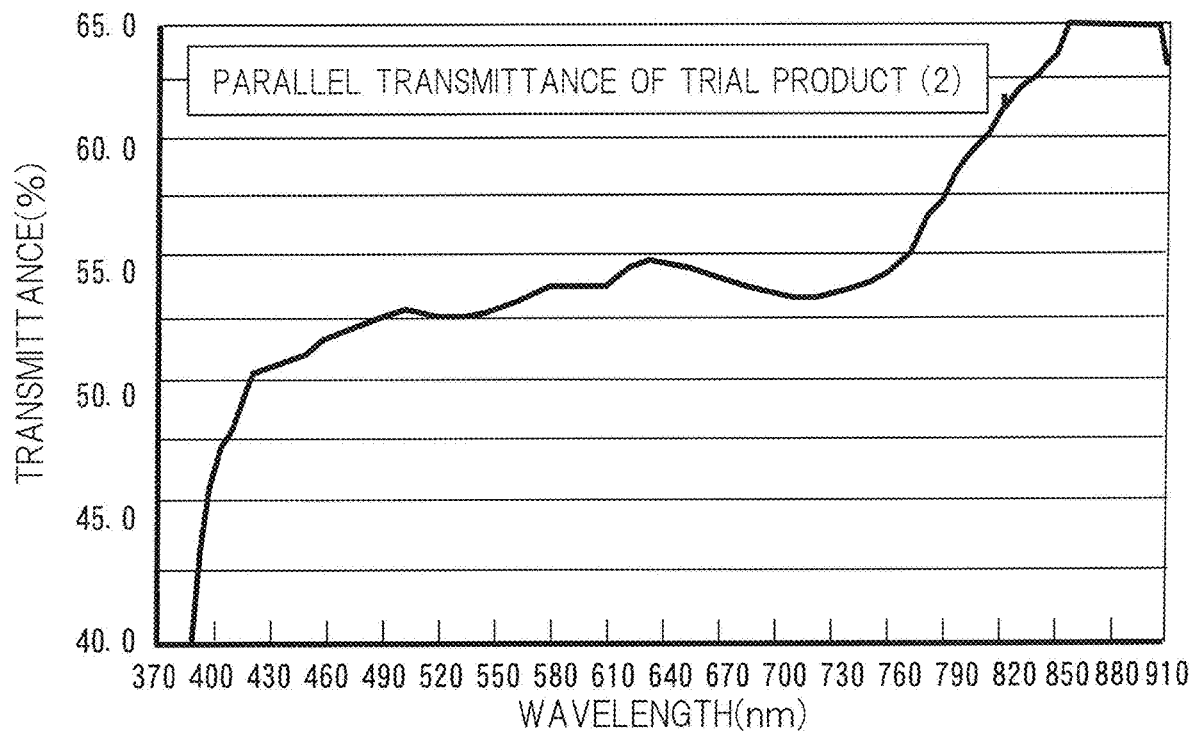
FIG. 8 is a characteristic diagram illustrating a parallel transmittance of the polarization plate according to the present invention (trial product (2))
Figure 9:
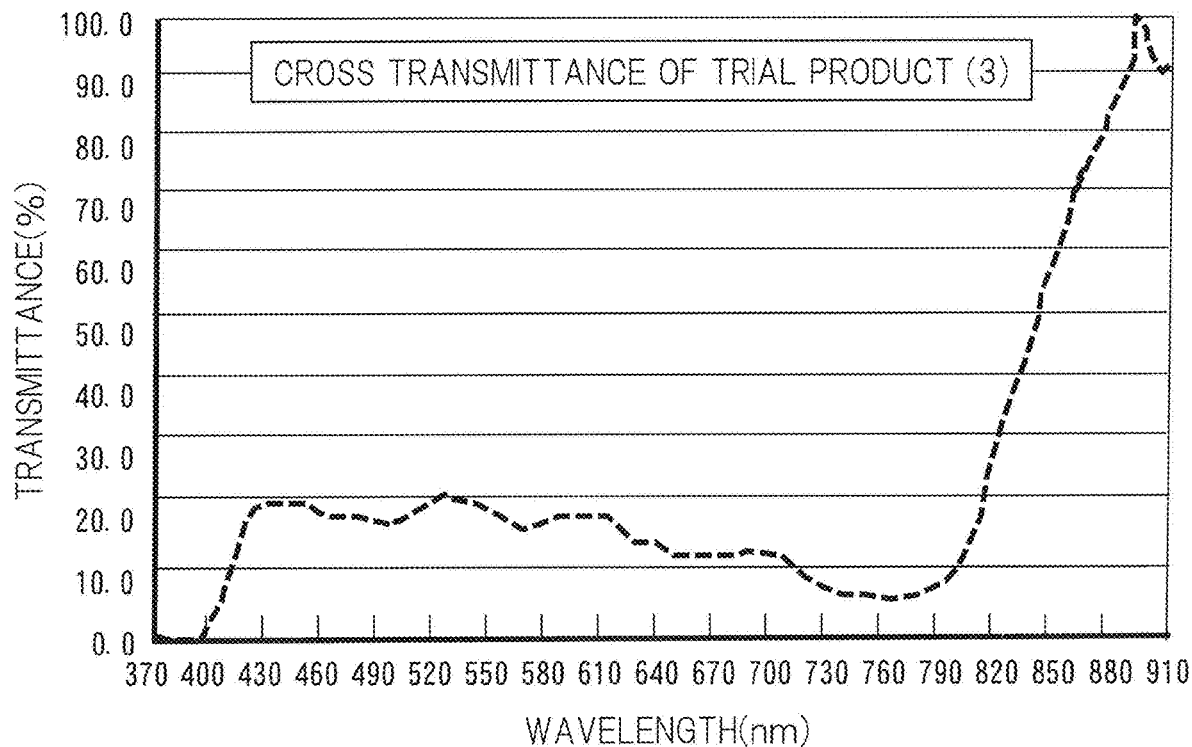
FIG. 9 is a characteristic diagram illustrating a cross transmittance of a polarization plate according to the present invention (trial product (3))
Figure 10:
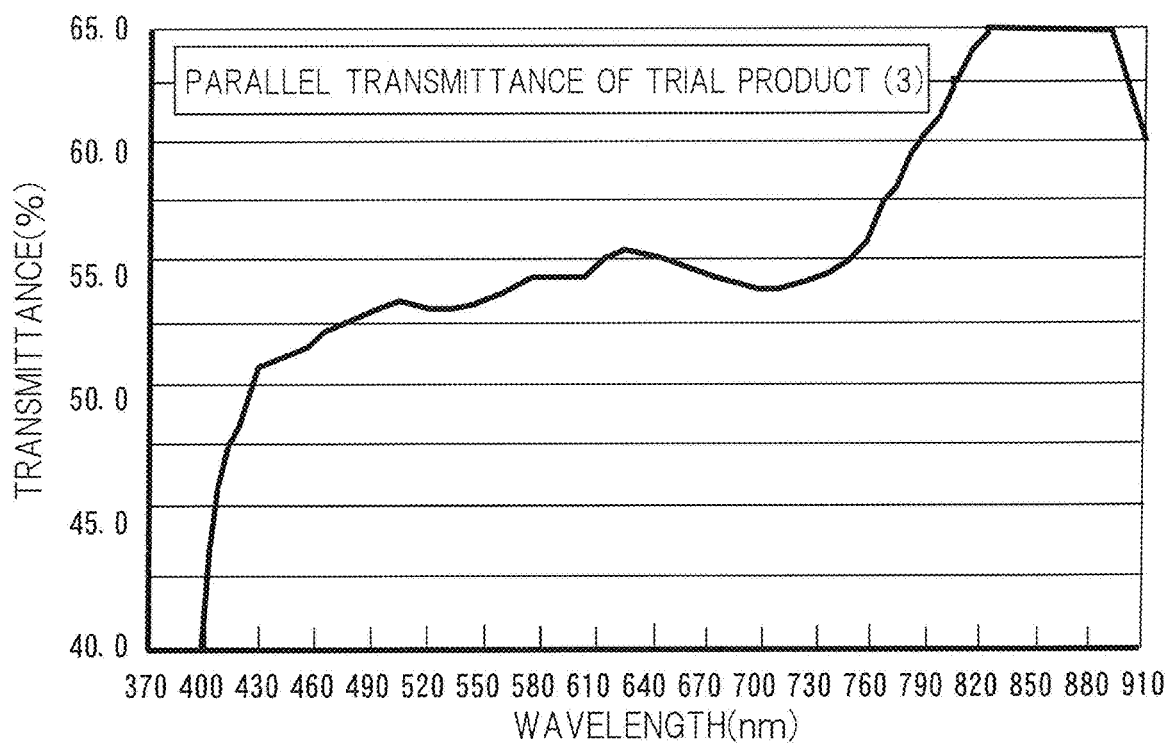
FIG. 10 is a characteristic diagram illustrating a parallel transmittance of the polarization plate according to the present invention (trial product (3))

FIG. 5 to FIG. 10 illustrate some of the characteristics of polarization plates produced as trial products (trial product (1), trial product (2), trial product (3)). Namely, the light ray transmittance in a case where two trial products (1) were prepared and the polarization axes of these two polarization plates were shifted by 90 degrees, i.e., the cross transmittance is illustrated in FIG. 5, while the light ray transmittance in a case where the polarization axes of these two polarization plates were aligned, i.e., the parallel transmittance is illustrated in FIG. 6. Likewise, the cross transmittance which is the light ray transmittance in a case where two trial products (2) were prepared and the polarization axes of these two polarization plates were shifted by 90 degrees is illustrated in FIG. 7, while the parallel transmittance which is the light ray transmittance in a case where the polarization axes of these two polarization plates were aligned is illustrated in FIG. 8. Furthermore, the cross transmittance in a case where two trial products (3) were prepared and the polarization axes of these two polarization plates were shifted by 90 degrees is illustrated in FIG. 9, while the parallel transmittance in a case where the polarization axes of these two polarization plates were aligned is illustrated in FIG. 9.

Figure 4:
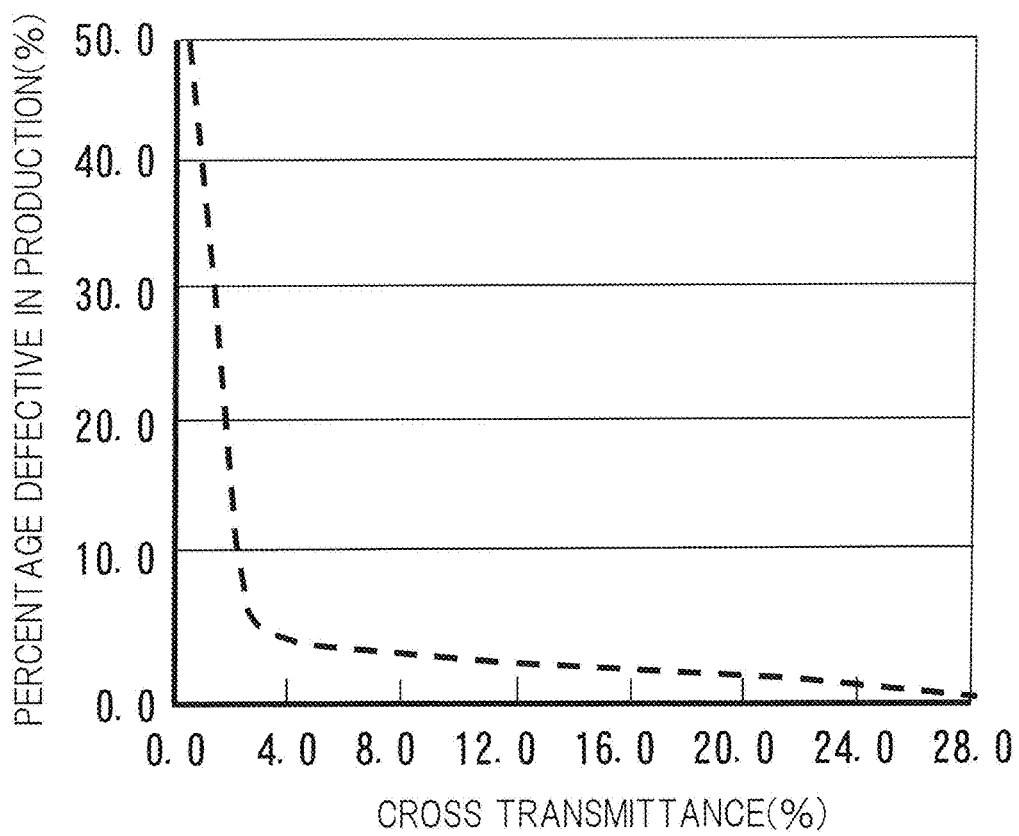
FIG. 4 is a schematic diagram illustrating a relationship of a percentage defective at the time of production of the onboard camera obtained by changing the characteristics of the polarization plate for describing the present invention.

As a result of the trial productions mentioned above, FIG. 4 shows that, when the cross transmittance (horizontal axis) indicating the degree of polarization of the polarization plate 150 was about 2% or less, there were cameras in which light amount did not reach the threshold value of the CMOS image sensor described above. Namely, there were many cameras which had large dark noise in the image and were determined to be defective products. Then, as a result of producing a plurality of polarization plates as trial products with using the cross transmittance as a parameter, it turned out that the defective products could be suppressed if the cross transmittance was more than 4%.

Meanwhile, if the cross transmittance mentioned above is increased, the parallel transmittance also increases as a side effect. On the other hand, when the parallel transmittance is too high, the transmittance of the P-polarized wave becomes high and the light ray transmittance itself increases, so that the original purpose of providing the polarization plate, i.e., preventing the reflection light L" on the front windshield FW from entering into the onboard camera 100 described above is not satisfied. Therefore, the inventor and others produced polarization plates as trial products with using also the parallel light ray transmittance as the design parameter, and found that the above problem could be alleviated when the parallel transmittance was set to 60% or less with respect to natural light with a wavelength of 420 nm to 700 nm.

From the foregoing, it was found that even if the polarization plate 150 having a lower degree of polarization was used instead of the polarization plate having the characteristics shown in FIG. 15 and FIG. 16 used conventionally (cross transmittance: 2% or less, parallel transmittance: 45% or less), the quality of the images acquired by the CMOS image sensor was not greatly degraded. Also, it was found that even if the polarization plate having the cross transmittance of 10% and the parallel transmittance of 50% or more and the characteristics shown in FIG. 7 and FIG. 8 (i.e., trial product (2)) was adopted, a preferable image could be acquired. Further, it was found that even if the polarization plate having the cross transmittance of 20% or less and the parallel transmittance of 55% or less and the characteristics shown in FIG. 9 and FIG. 10 (trial product (3)) was adopted instead of a conventional polarization plate (cross transmittance: 2% or less, parallel transmittance: 45% or less), an onboard camera that was mounted inside the vehicle and had sufficient capability to shoot forward through the windshield could be realized.

According to the consideration of the inventor and others of this application, this is because when the polarization plate 150 having the parallel transmittance of 60% with respect to natural light is adopted, the light amount passing through the polarization plate 150 becomes 50%+10%

(S-polarized wave) from 50% (P-polarized wave) and the light amount entering into the CMOS sensor is increased by about 20%.

As described above, according to the onboard camera 100 of the present invention which is mounted inside a vehicle such as automobile and shoots forward through the windshield, since the reflection light reflected by the windshield due to the scattering and the like of the light ray group that has fallen on the dashboard D can be appropriately attenuated by the function of the polarization plate 150 attached to the front face of the onboard camera 100 and having the polarization characteristics described above, the reflection light reflected on the windshield and entering into the onboard camera 100 described above can be reduced, and a preferable external image can be obtained without degrading the contrast of the image captured by the camera 100. Accordingly, it is possible to provide an onboard camera that can acquire images that are not different from human vision.

In addition, according to the above-described polarization plate 150, even during the driving at night or in a tunnel in particular, the light amount to the onboard camera 100 can be sufficiently ensured, so that preferable external images can be acquired even by a CMOS image sensor having a relatively low sensitivity.

Namely, since the onboard camera 100 according to the present invention can be made only by selecting the polarization characteristics of the polarization plate 150 in the conventional configuration, the onboard camera 100 according to the present invention can be easily realized, and is superior economically and practically. In addition, as compared with the polarization plate having the cross transmittance of 2% or less and the parallel transmittance of 45% or less, the polarization plate having the cross transmittance of 10% or less and the parallel transmittance of 60% or less described above is inferior in the polarization characteristics, but can be easily mass-produced and obtained relatively at lower cost, and is thus advantageous in that the manufacturing cost as the whole device can be reduced. According to the results of various experiments conducted by the inventor and others, it was found that sufficient performance could be ensured even when the polarization plate 150 having the transmittance of 3 to 10% as the cross transmittance mentioned above was used.

Figure 11:
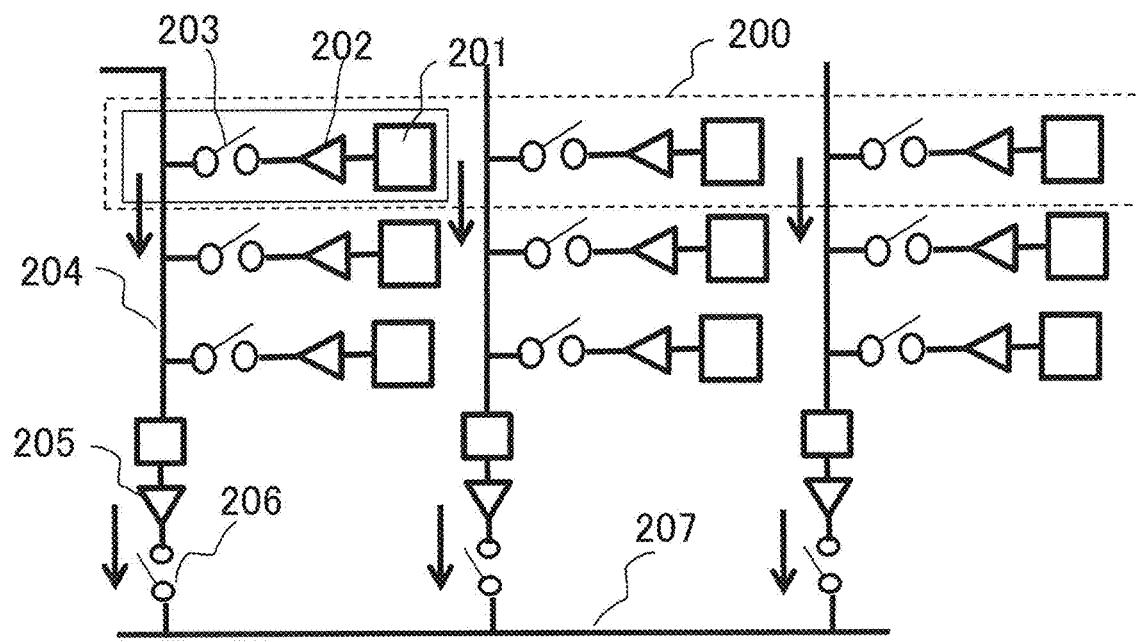
FIG. 11 is a block diagram for describing a reading method and a structure in a generally-available image-capturing device (CMOS)
Figure 13:
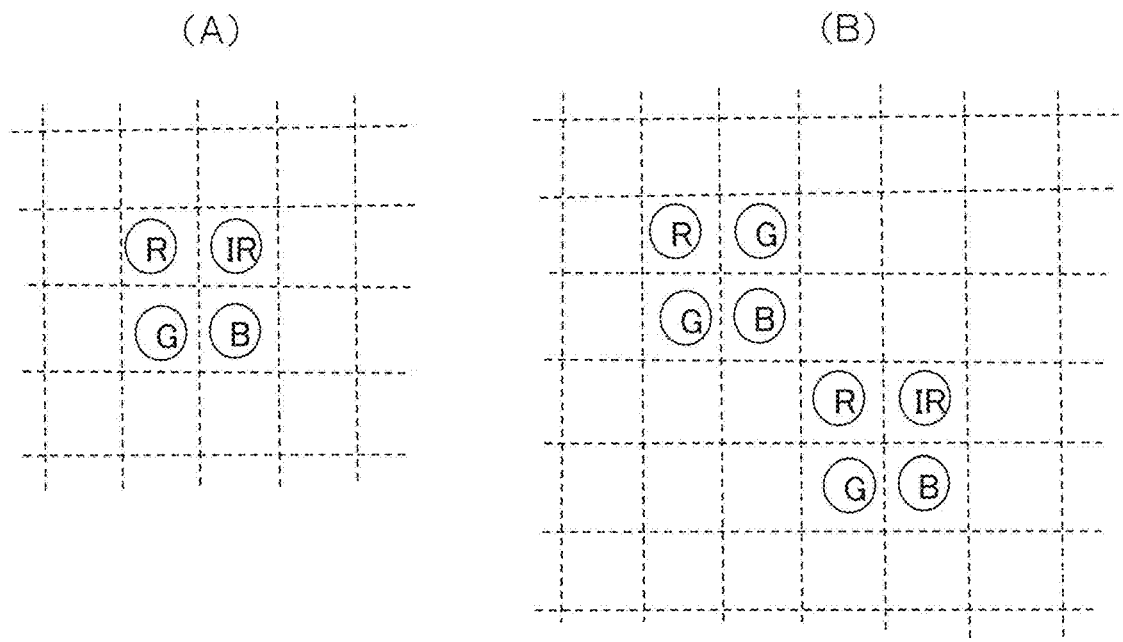
FIG. 13 is a layout diagram illustrating one embodiment of a pixel array of an image-capturing device according to the present invention and a modification example thereof.
Figure 14:
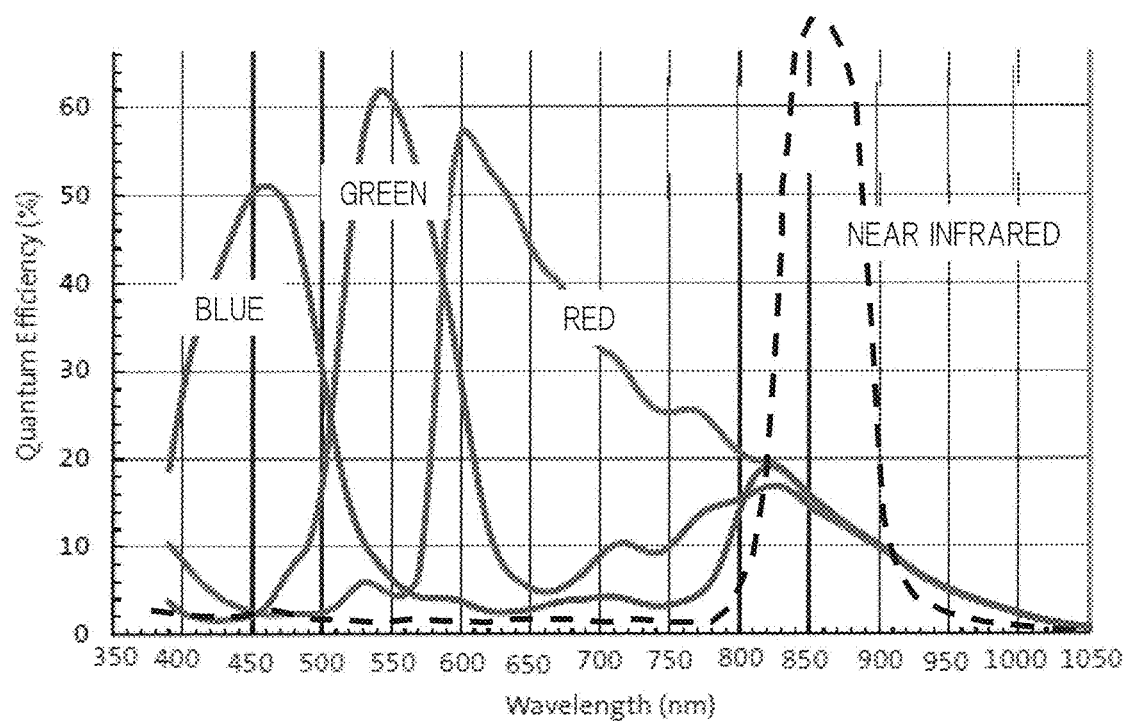
FIG. 14 is a characteristic diagram illustrating one embodiment of filter characteristics corresponding to the pixels of the image-capturing device (CMOS) according to the present invention.
Figure 17:
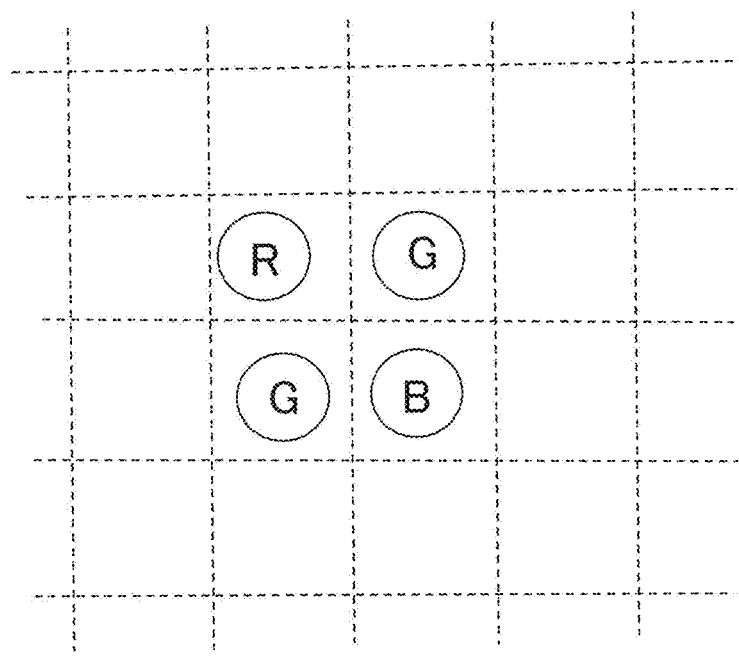
FIG. 17 is a layout diagram illustrating one embodiment of a pixel array of the generally-available image-capturing device.

Subsequently, the onboard camera 100 capable of sufficiently ensuring the light amount to the onboard camera 100 even during the driving at night or in a tunnel will be described in details with reference to FIG. 11 to FIG. 14 and FIG. 17. FIG. 11 is a block diagram for describing a reading method and a structure in a generally-available image-capturing device (CMOS), FIG. 12 is a cross-sectional view for describing a structure of a generally-available image-capturing device (CMOS), FIG. 13 is a layout diagram illustrating one embodiment of a pixel array of the image-capturing device according to the present invention and a modification example thereof, FIG. 14 is a characteristic diagram illustrating one embodiment of filter characteristics corresponding to the pixels of the image-capturing device (CMOS) according to the present invention, and FIG. 17 is a layout diagram illustrating one embodiment of a pixel array of a generally-available (conventional) image-capturing device.

In general, as shown in FIG. 11, the CMOS image sensor includes a large number of pixels 200 arrayed on a base plate, and each pixel 200 is constituted of three photodiodes 201 corresponding to R (red), G (green), and B (blue) lights that are incident from the outside. The CMOS image sensor has a structure in which the charge generated in each photodiode 201 is led to a vertical signal line 204 via an amplifier 202 and a pixel selection switch 203, and is further led to a horizontal signal line 207 via an amplifier 205 and a column selection switch 206.

Figure 12:
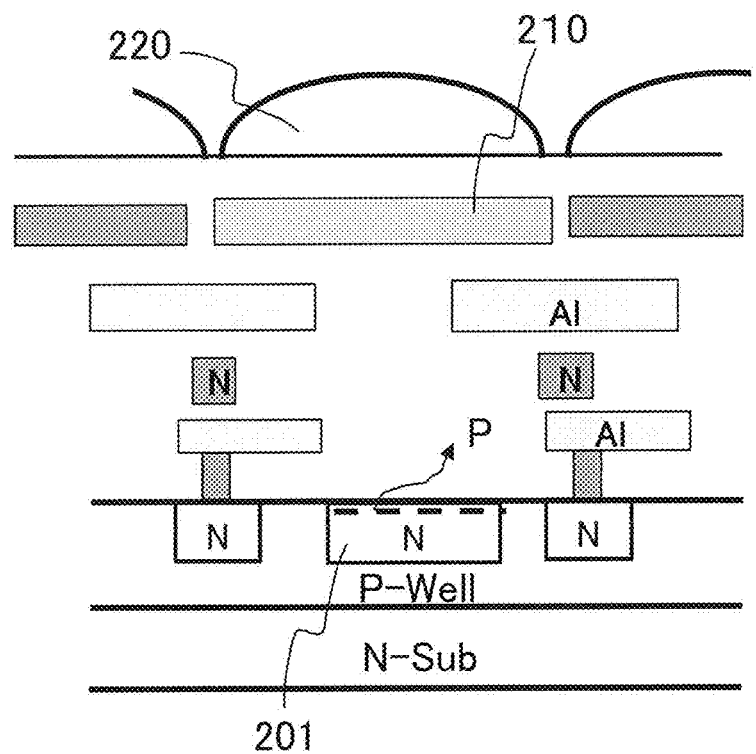
FIG. 12 is a cross-sectional view for describing a structure of a generally-available image-capturing device (CMOS)

Then, as shown in FIG. 12, an on-chip color filter 210 for transmitting the corresponding color light is disposed together with various kinds of wirings and layers above each photodiode 201 constituting the pixel 200 so as to cover the photodiode. Furthermore, an on-chip lens 220 is formed on the upper surface thereof.

In an actual CMOS image sensor, many photodiodes are formed on the above-mentioned base plate from the manufacturing process thereof. Also, as shown in FIG. 17 seen from above each pixel of the CMOS image sensor, each pixel is constituted of not only three photodiodes corresponding to R, G, B but also four photodiodes adjacent to each other, and one photodiode among them is constituted such that the light from the outside is not incident thereon or a color light having a high relative visibility (for example, G light) is enhanced. More specifically, the on-chip color filters 210 formed above the three photodiodes corresponding to R, G, and B are made of a material that transmits the corresponding color lights, and the remaining one photodiode is made of a non-translucent material or a material that transmits G light as indicated by "G" in FIG. 17.

In the present invention, in the configuration of the CMOS image sensor described above, the on-chip color filters 210 arrayed to cover each of the photodiodes 201 are arrayed also in the manner shown in FIG. 13(A). More specifically, for example, three of the four on-chip color filters 210 adjacent to each other are conventional filters that transmit the R, G, and B lights, and the remaining one on-chip color filter 210 (corresponding to "G" in FIG. 17) is a filter capable of transmitting near infrared light (IR) having a spectral transmittance indicated by a broken line in FIG. 14.

More specifically, the CMOS image sensor as the image-capturing device that constitutes the camera unit is configured with four pixels as one unit, the filter constituting the first pixel (B) is configured such that the transmittance with respect to the light having a wavelength from 400 nm to 500 nm is 25% or more and the transmittance with respect to the light having a wavelength from 550 nm to 750 nm is 10% or less, the filter constituting the second pixel (G) is configured such that the transmittance with respect to the light having a wavelength from 510 nm to 590 nm is 25% or more, the transmittance with respect to the light having a wavelength from 400 nm to 500 nm is 15% or less, and the transmittance with respect to the light having a wavelength from 620 nm to 750 nm is 15% or less, the filter constituting the third pixel (R) is configured such that the transmittance with respect to the light having a wavelength from 590 nm to 700 nm is 30% or more, the transmittance with respect to the light having a wavelength from 400 nm to 570 nm is 10% or less, and the light ray transmittance with respect to the light having a wavelength of 800 nm or more is 20% or less, and the filter constituting the fourth pixel (IR) is capable of transmitting near infrared light having a wavelength from 850 nm to 900 nm.

According to such a structure, the CMOS image sensor can detect not only R (red) G (green) B (blue) lights incident from the outside but also infrared light (IR). Accordingly, since the semiconductor image-capturing device 103 constituting the above-described camera 100 can detect not only R, G, and B lights which can be perceived by human eyes but also the infrared light (IR), more appropriate recognition can be made by using the infrared light (IR) during the vehicle driving at night or in a tunnel and even under circumstances such as dense fog and rain/snowfall in which sufficient recognition is impossible by the perception of the human eyes alone.

Even in this case, a polarization plate whose transmittance with respect to the infrared light is 45% or more and 100% or less is used as the polarization plate 150 for cutting (attenuating) the S-polarized light attached to the front face of the onboard camera 100. Further, it is preferable to select a polarization plate whose transmittance with respect to near infrared light having a wavelength of 850 nm is 70% or more (100% or less), more preferably, 90% or more (100% or less).

In addition, as another configuration of the above-mentioned CMOS image sensor, other than the array shown in FIG. 13(A), i.e., the configuration in which one of the four on-chip color filters adjacent to each other is a filter that can transmit the infrared light (IR), the configuration shown in FIG. 13(B) in which some of the on-chip color filters (sixteen on-chip color filters in this case) constituting multiple adjacent pixels (four adjacent pixels in this case) are filters that can transmit the infrared light (IR) is also possible. In this case, relatively, the G light of the light emission output thereof can be enhanced.

In the above-described embodiment, the onboard camera which is mounted in the vehicle and shoots forward through the front windshield FW has been described as the camera to which the present invention is applied, but the present invention is not limited to the above. For example, it would be obvious for a person skilled in the art that the present invention can be applied also to onboard cameras which shoot the back and sides of the vehicle and further to a camera which stereoscopically shoots forward of the vehicle, i.e., a so-called stereo camera.

REFERENCE SIGNS LIST

100 . . . onboard camera, 11 . . . street light, 101 . . . housing, 102 . . . base plate, 103 . . . semiconductor image-capturing device, 104 . . . lens unit, 105 . . . lens hood, 106 . . . groove, 150 . . . polarization plate, FW . . . front windshield, DB . . . dashboard, 200 . . . each pixel, 201 . . . photodiode, 202 . . . amplifier, 203 . . . pixel selection switch, 204 . . . vertical signal line, 205 . . . amplifier, 206 . . . column selection switch, 207 . . . horizontal signal line, 210 . . . on-chip color filter, 220 . . . on-chip lens

The invention claimed is:

1. An onboard camera mounted in a vehicle to shoot a driving environment of the vehicle by receiving external light from outside of the vehicle through a front windshield of the vehicle and reflection light reflected on the front windshield, the onboard camera comprising:
a camera unit including a lens unit which generates an image by receiving the external light and an image-capturing device which generates an image signal based on the image generated by the lens unit; and
a polarization plate arranged in front of the camera unit, wherein the image-capturing device constituting the camera unit is a CMOS image sensor including a pixel array in which a plurality of pixel units are arranged, and
the polarization plate is a polarization plate whose cross transmittance with respect to S-polarized wave having a wavelength from 420 nm to 700 nm is 5 to 20%, and the pixel array includes:
a first pixel unit configured to have four pixels of a first pixel corresponding to blue light, a second pixel corresponding to green light, a third pixel corresponding to red light, and a fourth pixel corresponding to near infrared light as one unit by arranging the first to fourth pixels adjacent to each other; and
a second pixel unit configured to have four pixels of a fifth pixel corresponding to blue light, a sixth pixel corresponding to green light, a seventh pixel corresponding to red light, and an eighth pixel corresponding to green light as one unit by arranging the fifth to eighth pixels adjacent to each other.

2. An onboard camera mounted in a vehicle to shoot a driving environment of the vehicle by receiving external light from outside of the vehicle through a front windshield of the vehicle and reflection light reflected on the front windshield, the onboard camera comprising:
a camera unit including a lens unit which generates an image by receiving the external light and an image-capturing device which generates an image signal based on the image generated by the lens unit; and
a polarization plate arranged in front of the camera unit, wherein the image-capturing device constituting the camera unit is a CMOS image sensor including a pixel array in which a plurality of pixel units are arranged, and
the polarization plate is a polarization plate whose parallel transmittance with respect to natural light having a wavelength from 420 nm to 700 nm is 45 to 60%, and the pixel array includes:
a first pixel unit configured to have four pixels of a first pixel corresponding to blue light, a second pixel corresponding to green light, a third pixel corresponding to red light, and a fourth pixel corresponding to near infrared light as one unit by arranging the first to fourth pixels adjacent to each other; and
a second pixel unit configured to have four pixels of a fifth pixel corresponding to blue light, a sixth pixel corresponding to green light, a seventh pixel corresponding to red light, and an eighth pixel corresponding to blue light as one unit by adjacently arranging the fifth to eighth pixels adjacent to each other.

3. The onboard camera according to claim 1, wherein a transmittance of the polarization plate with respect to infrared light is 45% or more and 100% or less.

4. The onboard camera according to claim 2, wherein a transmittance of the polarization plate with respect to infrared light is 45% or more and 100% or less.

5. The onboard camera according to claim 1, wherein the first pixel is configured such that a transmittance with respect to light having a wavelength from 400 nm to 500 nm is 25% or more and a transmittance with respect to light having a wavelength from 550 nm to 750 nm is 10% or less,
the second pixel is configured such that a transmittance with respect to light having a wavelength from 510 nm to 590 nm is 25% or more, a transmittance with respect to light having a wavelength from 400 nm to 500 nm is 15% or less, and a transmittance with respect to light having a wavelength from 620 nm to 750 nm is 15% or less,
the third pixel is configured such that a transmittance with respect to light having a wavelength from 590 nm to 700 nm is 30% or more, a transmittance with respect to light having a wavelength from 400 nm to 570 nm is 10% or less, and a light ray transmittance with respect to light having a wavelength of 800 nm or more is 20% or less, the fourth pixel has a structure capable of detecting near infrared light having a wavelength from 850 nm to 900 nm, the fifth pixel is configured such that a transmittance with respect to light having a wavelength from 400 nm to 500 nm is 25% or more and a transmittance with respect to light having a wavelength from 550 nm to 750 nm is 10% or less, the sixth pixel and the eighth pixel are configured such that a transmittance with respect to light having a wavelength from 510 nm to 590 nm is 25% or more, a transmittance with respect to light having a wavelength from 400 nm to 500 nm is 15% or less, and a transmittance with respect to light having a wavelength from 620 nm to 750 nm is 15% or less, and the seventh pixel is configured such that a transmittance with respect to light having a wavelength from 590 nm to 700 nm is 30% or more, a transmittance with respect to light having a wavelength from 400 nm to 570 nm is 10% or less, and a light ray transmittance with respect to light having a wavelength of 800 nm or more is 20% or less.

6. The onboard camera according to claim 2, wherein the first pixel is configured such that a transmittance with respect to light having a wavelength from 400 nm to 500 nm is 25% or more and a transmittance with respect to light having a wavelength from 550 nm to 750 nm is 10% or less, the second pixel is configured such that a transmittance with respect to light having a wavelength from 510 nm to 590 nm is 25% or more, a transmittance with respect to light having a wavelength from 400 nm to 500 nm is 15% or less, and a transmittance with respect to light having a wavelength from 620 nm to 750 nm is 15% or less, the third pixel is configured such that a transmittance with respect to light having a wavelength from 590 nm to 700 nm is 30% or more, a transmittance with respect to light having a wavelength from 400 nm to 570 nm is 10% or less, and a light ray transmittance with respect to light having a wavelength of 800 nm or more is 20% or less, the fourth pixel has a structure capable of detecting near infrared light having a wavelength from 850 nm to 900 nm, the fifth pixel is configured such that a transmittance with respect to light having a wavelength from 400 nm to 500 nm is 25% or more and a transmittance with respect to light having a wavelength from 550 nm to 750 nm is 10% or less, the sixth pixel and the eighth pixel are configured such that a transmittance with respect to light having a wavelength from 510 nm to 590 nm is 25% or more, a transmittance with respect to light having a wavelength from 400 nm to 500 nm is 15% or less, and a transmittance with respect to light having a wavelength from 620 nm to 750 nm is 15% or less, and the seventh pixel is configured such that a transmittance with respect to light having a wavelength from 590 nm to 700 nm is 30% or more, a transmittance with respect to light having a wavelength from 400 nm to 570 nm is 10% or less, and a light ray transmittance with respect to light having a wavelength of 800 nm or more is 20% or less.

* * * * *